US010476553B2

(12) United States Patent
Qiu et al.

(10) Patent No.: US 10,476,553 B2
(45) Date of Patent: Nov. 12, 2019

(54) ENERGY TRANSMISSION USING WIRELESS COMMUNICATION SYSTEM

(71) Applicant: Shenzhen Suteng JuChuang Technologies Ltd. Co., Shenzhen (CN)

(72) Inventors: Chunxin Qiu, Shenzhen (CN); Letian Liu, Shenzhen (CN)

(73) Assignee: Shenzhen Suteng JuChuang Technologies Ltd. Co., Shenzhen (CN)

( * ) Notice: Subject to any disclaimer, the term of this patent is extended or adjusted under 35 U.S.C. 154(b) by 0 days.

(21) Appl. No.: 16/095,328

(22) PCT Filed: May 11, 2016

(86) PCT No.: PCT/CN2016/081766
§ 371 (c)(1),
(2) Date: Oct. 19, 2018

(87) PCT Pub. No.: WO2017/181454
PCT Pub. Date: Oct. 26, 2017

(65) Prior Publication Data
US 2019/0140698 A1   May 9, 2019

(30) Foreign Application Priority Data
Apr. 20, 2016   (CN) .......................... 2016 1 0250794

(51) Int. Cl.
*H04B 5/00*   (2006.01)
*H04W 52/06*   (2009.01)
(Continued)

(52) U.S. Cl.
CPC ............ *H04B 5/0037* (2013.01); *H02J 50/12* (2016.02); *H03K 17/6871* (2013.01);
(Continued)

(58) Field of Classification Search
CPC ..... H04B 5/0037; H04B 5/0093; H02J 50/12; H03K 17/6871; H04W 52/06
(Continued)

(56) References Cited

U.S. PATENT DOCUMENTS

2014/0339991 A1* 11/2014 Zhang ...................... G09G 3/36
315/186
2014/0361759 A1* 12/2014 Lei ........................... H02M 1/08
323/288
(Continued)

FOREIGN PATENT DOCUMENTS

CN       101154955 A       4/2008
CN       103595145 A       2/2014
(Continued)

OTHER PUBLICATIONS

International Search Report for PCT/CN2016/081766.
Written Opinion for PCT/CN2016/081766.

*Primary Examiner* — Edward F Urban
*Assistant Examiner* — Max Mathew
(74) *Attorney, Agent, or Firm* — Rimon PC

(57) ABSTRACT

The present invention relates to a wireless communication system with an energy transmission function. An output terminal of a control module is connected with an input terminal of an LVDS conversion module and an input terminal of a MOS driving module, respectively. An output terminal of the MOS driving module is connected with an input terminal of a MOS power amplifier module. The MOS power amplifier module is electrically connected with a power supply. An output terminal of the MOS power amplifier module is connected with an input terminal of an electric-to-magnetic conversion module. The input terminal of the electric-to-magnetic conversion module is also connected with an output terminal of the LVDS conversion module. An output terminal of an electric-to-magnetic con-
(Continued)

version module is connected with an input terminal of a magnetic-ring coupling module. An output terminal of the magnetic-ring coupling module is connected with an input terminal of a magnetic-to-electric conversion module. An output terminal of the magnetic-to-electric conversion module is connected with an input terminal of a rectifier and voltage regulator module and an input terminal of a TTL signal conversion module, respectively; an output terminal of the TTL signal conversion module is connected with an input terminal of a receiving module, and an output terminal of the rectifier and voltage regulator module is connected with the an input terminal of the voltage output module. The embodiment is simple in structure and high in efficiency.

10 Claims, 4 Drawing Sheets

(51) Int. Cl.
*H02J 50/12* (2016.01)
*H03K 17/687* (2006.01)
*H04W 84/18* (2009.01)
(52) U.S. Cl.
CPC .......... *H04B 5/0093* (2013.01); *H04W 52/06* (2013.01); *H04W 84/18* (2013.01)

(58) Field of Classification Search
USPC ................................................ 455/41.1, 41.2
See application file for complete search history.

(56) References Cited

U.S. PATENT DOCUMENTS

| | | | |
|---|---|---|---|
| 2017/0005502 A1* | 1/2017 | Wang | H02J 7/02 |
| 2019/0140483 A1* | 5/2019 | Ikefuji | H02J 50/12 |
| 2019/0165609 A1* | 5/2019 | An | H02J 50/10 |
| 2019/0165612 A1* | 5/2019 | Polu | H02J 50/12 |
| 2019/0165617 A1* | 5/2019 | Clark | H02J 50/40 |
| 2019/0165619 A1* | 5/2019 | Park | H02J 50/80 |

FOREIGN PATENT DOCUMENTS

| | | |
|---|---|---|
| CN | 104158304 A | 11/2014 |
| CN | 104158305 A | 11/2014 |
| CN | 104283238 A | 1/2015 |
| CN | 104283239 A | 1/2015 |
| CN | 104852442 A | 8/2015 |
| CN | 105141045 A | 12/2015 |
| EP | 2194652 A1 | 6/2010 |
| WO | 2005003983 A1 | 1/2005 |

* cited by examiner

ENERGY TRANSMISSION USING WIRELESS COMMUNICATION SYSTEM

RELATED APPLICATIONS

The present application is a US national phase application of and claims priority to PCT application PCT/CN2016/081766 filed on Apr. 22, 2016 and titled Energy Transmission Using Wireless Communication System, the content of which is incorporated herein in its entirety.

BACKGROUND

Technical Field

The present invention belongs to the technical field of wireless communication, and in particular relates to a wireless communication system with an energy transmission function.

Description of Related Art

As an energy transmission means, wireless energy transmission can realize electric energy transmission in non-contact state, without using media such as cables. In recent years, wireless energy transmission has been successfully applied to fields such as wireless charging, and has also been developed in combined fields like simultaneous wireless energy and information transmission. At present, two methods are available for carrying out simultaneous wireless energy and information transmission, namely magnetic resonance and microwave radiation transmission, which respectively correspond to narrow-band and broadband communication systems.

As a novel wireless power supply technology, non-radiative magnetic coupling resonance refers to using two resonant objects with the same frequency to generate very strong mutual coupling and to perform weak coupling with surrounding receiving terminals without a resonance frequency. A magnetic coupling resonance system includes a resonance transmitting coil, a secondary resonance receiving coil and a load. Wireless power supply application sites usually need wireless communication, mainly classified into single-flow mode and dual-flow mode according to the realization approach of an energy flow and an information flow. In the dual-flow mode, the energy flow and the information flow are achieved separately, for example, the information flow is achieved by wireless devices such as Bluetooth. The dual-flow mode is relatively high in cost and complicated in circuit. In the single-flow mode, one set of devices can realize multiplexing of the energy flow and information flow.

The current research on the wireless energy and information transmission mainly focuses on the physical design of antennas and radio frequency units to improve the efficiency of simultaneous transmission of wireless energy and information during point-to-point transmission among devices. However, in the case that distributed networking is performed on a plurality of devices, there is no relevant research on the approach for controlling the conversion between wireless energy transmission and information transmission for each device on the basis of the time-division approach. Obviously, the traditional distributed communication protocol CSMA based on the time-division approach cannot be directly applied to the distributed networking of novel devices which adopt the wireless energy and information transmission technology. Therefore, it is needed to design the device networking protocol in such scenarios by introducing the wireless energy and information transmission into distributed wireless networks where energy is limited (for example, a wireless sensor network), so as to prolong the service life of batteries of devices in such networks.

SUMMARY

The objective of the present invention is to provide a wireless communication system with an energy transmission function, aiming at the above-mentioned technical problems.

The present invention adopts the following technical solution: a wireless communication system with an energy transmission function is provided; the wireless communication system includes a control module, a MOS driving module, a MOS power amplifier module, an electric-to-magnetic conversion module, a magnetic-to-electric conversion module, a rectifier and voltage regulator module, a voltage output module, an LVDS conversion module, a TTL signal conversion module, a receiving module, a magnetic-ring coupling module and a power supply; an output terminal of the control module is connected with an input terminal of the LVDS conversion module and an input terminal of the MOS driving module, respectively; an output terminal of the MOS driving module is connected with an input terminal of the MOS power amplifier module; the MOS power amplifier module is electrically connected with the power supply; an output terminal of the MOS power amplifier module is connected with an input terminal of the electric-to-magnetic conversion module; the input terminal of the electric-to-magnetic conversion module is also connected with an output terminal of the LVDS conversion module; an output terminal of the electric-to-magnetic conversion module is connected with an input terminal of the magnetic-ring coupling module; an output terminal of the magnetic-ring coupling module is connected with an input terminal of the magnetic-to-electric conversion module; an output terminal of the magnetic-to-electric conversion module is connected with an input terminal of the rectifier and voltage regulator module and an input terminal of the TTL signal conversion module, respectively; an output terminal of the TTL signal conversion module is connected with an input terminal of the receiving module, and an output terminal of the rectifier and voltage regulator module is connected with the an input terminal of the voltage output module.

The present invention adopts a further technical solution: the electric-to-magnetic conversion module includes an electric-to-magnetic energy conversion unit and an electric-to-magnetic signal conversion unit; an input terminal of the electric-to-magnetic energy conversion unit is connected with the output terminal of the MOS power amplifier module; and an input terminal of the electric-to-magnetic signal conversion unit is connected with the output terminal of the LVDS conversion module.

The present invention adopts a further technical solution: the magnetic-ring coupling module includes an energy magnetic-ring unit and a signal magnetic-ring unit; an input terminal of the energy magnetic-ring unit is connected with an output terminal of the electric-to-magnetic energy conversion unit; and an input terminal of the signal magnetic-ring unit is connected with an output terminal of the electric-to-magnetic signal conversion unit.

The present invention adopts a further technical solution: the magnetic-to-electric conversion module includes a magnetic-to-electric energy conversion unit and a magnetic-toelectric signal conversion unit; an input terminal of the magnetic-to-electric energy conversion unit is connected with an output terminal of the energy magnetic-ring unit; an output terminal of the magnetic-to-electric energy conversion unit is connected with the input terminal of the rectifier and voltage regulator module; the input terminal of the signal magnetic-ring unit is connected with an the output terminal of the signal magnetic-ring unit; an input terminal of the magnetic-to-electric signal conversion unit is connected with the output terminal of the signal magnetic-ring unit; and an output terminal of the magnetic-to-electric signal conversion unit is connected with the input terminal of the TTL signal conversion module.

The present invention adopts a further technical solution: the MOS driving module includes a first driving unit and a second driving unit; the first driving unit is identical with the second driving unit, including a resistor R1, a resistor R2, a capacitor C1, a resistor R3, a resistor R4, a resistor R5, a resistor R6, a resistor R7, a resistor R8, a chip U1, a diode D1 and a diode D2; a second pin of the chip U1 is connected with one end of the resistor R1 and a signal PWMHII, respectively; a third pin of the chip U1 is connected with one end of the resistor R2 and a signal PWNLII, respectively; an eighth pin of the chip U1 is connected with one end of the resistor R6, one end of the resistor R7 and the cathode of the diode D1, respectively; a fifth pin of the chip U1 is connected with one end of the resistor R3, one end of the resistor R4 and a cathode of the diode D2, respectively; an anode of the diode D1 is connected with one end of the resistor R8; an anode of the diode D2 is connected with one end of the resistor R5; a seventh pin of the chip U1 connects the capacitor C2 to the eighth pin of the chip U1 and outputs; the other end of the resistor R6 is grounded through a bonding pad; the other end of the resistor R3 is grounded through a bonding pad; a sixth pin of the chip U1 is connected with one end of the capacitor C1 and a power supply VCC+5V, respectively; the other end of the capacitor C1, the other end of the resistor R1, the other end of the resistor R2, and a fourth pin of the chip U1 are all grounded.

The present invention adopts a further technical solution: the MOS power amplifier module includes a first amplifier unit and a second amplifier unit; the first amplifier unit is identical with the second amplifier unit, including a MOS transistor Q1, a MOS transistor Q2, a resistor R14, a resistor R10, a resistor R13, a capacitor C4, a resistor R12, a resistor R9, a resistor R11 and a capacitor C3; a gate of the MOS transistor Q1 is connected with the other end of the resistor R8 and the other end of the resistor R7, respectively; a source of the MOS transistor Q1 is connected with one end of the resistor R10, one end of the resistor R11 and one end of the capacitor C3, respectively; a drain of the MOS transistor Q1 is connected with one end of the resistor R9 and a power supply VCC, respectively; the other end of the resistor R9 is connected with the other end of the capacitor C3; the resistor R10 is connected with a first pin of the chip U1 and one end of the capacitor C2, respectively, through a bonding pad; the other end of the resistor R11 is connected with one end of the resistor R12, a drain of the MOS transistor Q2, the first pin of the chip U1, one end of the capacitor C2 and the electric-to-magnetic conversion module, respectively; a gate of the MOS transistor Q2 is connected with the other end of the resistor R4 and the other end of the resistor R5, respectively; a source of the MOS transistor Q2 is connected with one end of the resistor R14 and one end of the resistor R13, respectively; the other end of the resistor R13 is grounded, and the other end of the resistor R14 is grounded through a bonding pad.

The present invention adopts a further technical solution: the control module is an FPGA, and the FPGA includes an energy output control signal processing unit and a data signal processing unit.

The present invention adopts a further technical solution: the rectifier and voltage regulator module includes a rectifier and filter unit and a voltage regulator unit, and an output terminal of the rectifier and filter unit is connected with an input terminal of the voltage regulator unit.

The present invention adopts a further technical solution: the rectifier and filter unit includes a capacitor C9, a capacitor C10, a diode D5, a diode D6, a diode D7 and a diode D8; an anode of the diode D5 is connected with a cathode of the diode D7 and the output terminal of the magnetic-to-electric conversion module, respectively; an anode of the diode D6 is connected with a cathode of the diode D8 and the output terminal of the electric-to-magnetic conversion module, respectively; a cathode of the diode D5 is connected with the cathode of the diode D6, one end of the capacitor C10 and one end of the capacitor C9, respectively; an anode of the diode D7 is connected with an anode of the diode D8, the other end of the capacitor C10 and the other end of the capacitor C9, respectively, and are all grounded.

The present invention adopts a further technical solution: the voltage regulator unit includes a voltage regulator chip U2, a capacitor C11 and a capacitor C12; a first pin of the voltage regulator chip U2 is connected with the cathode of the diode D5, the cathode of the diode D6, one end of the capacitor C10 and one end of the capacitor C9, respectively; a third pin of the voltage regulator chip U2 is connected with one end of the capacitor C11 and one end of the capacitor C12, respectively, and outputs; and a second pin of the voltage regulator chip U2, the other end of the capacitor C11 and the other end of the capacitor C12 are all grounded.

The present invention has the following beneficial effects: by adopting the FPGA, the electric and high-speed digital signals are transmitted at the same time, ensuring completely independent transmission of the electric and digital signals in the transmission process; the system is simple in structure, convenient in use, and high in efficiency.

DETAILED DESCRIPTION

Figure 1:
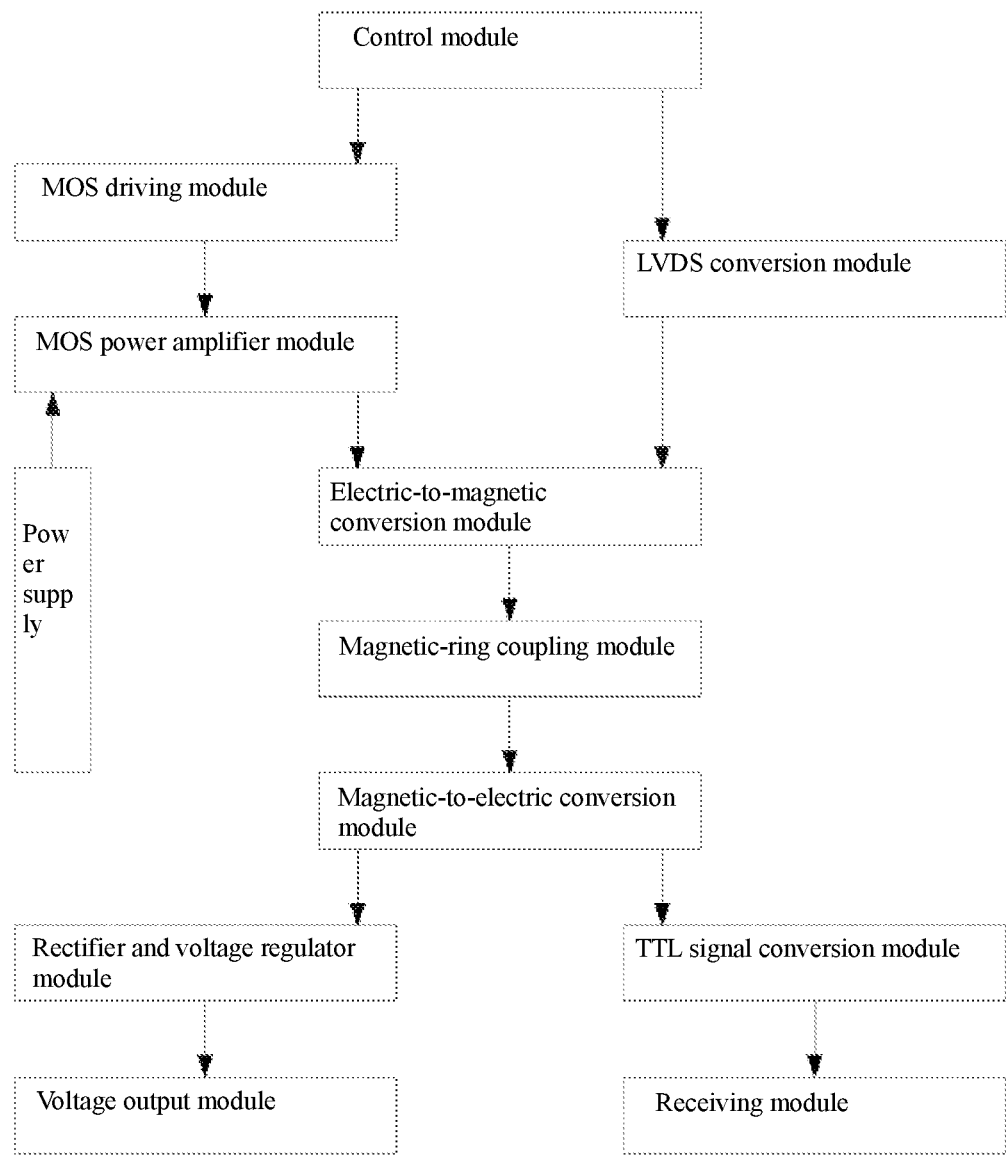
FIG. 1 is a structural block diagram of a wireless communication system with an energy transmission function in an embodiment of the present invention.
Figure 2:
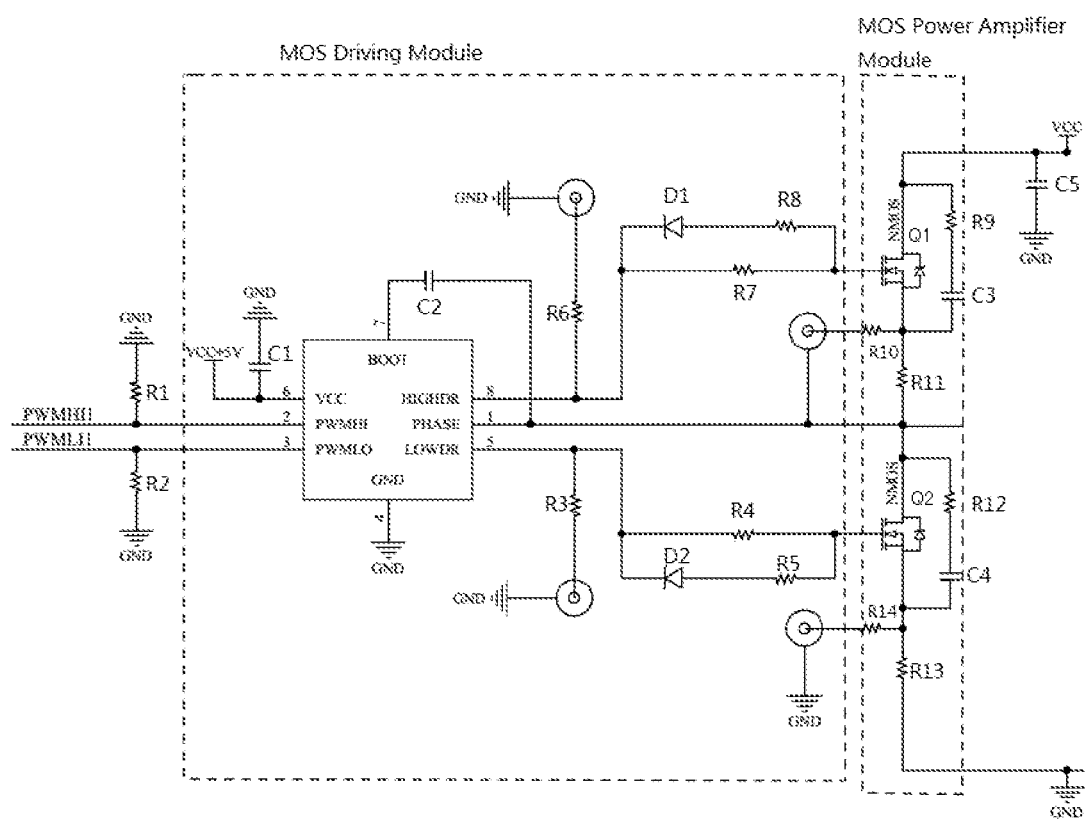
FIG. 2 is an electric schematic diagram of a MOS driving module and a MOS power amplifier module provided in an embodiment of the present invention.
Figure 3:
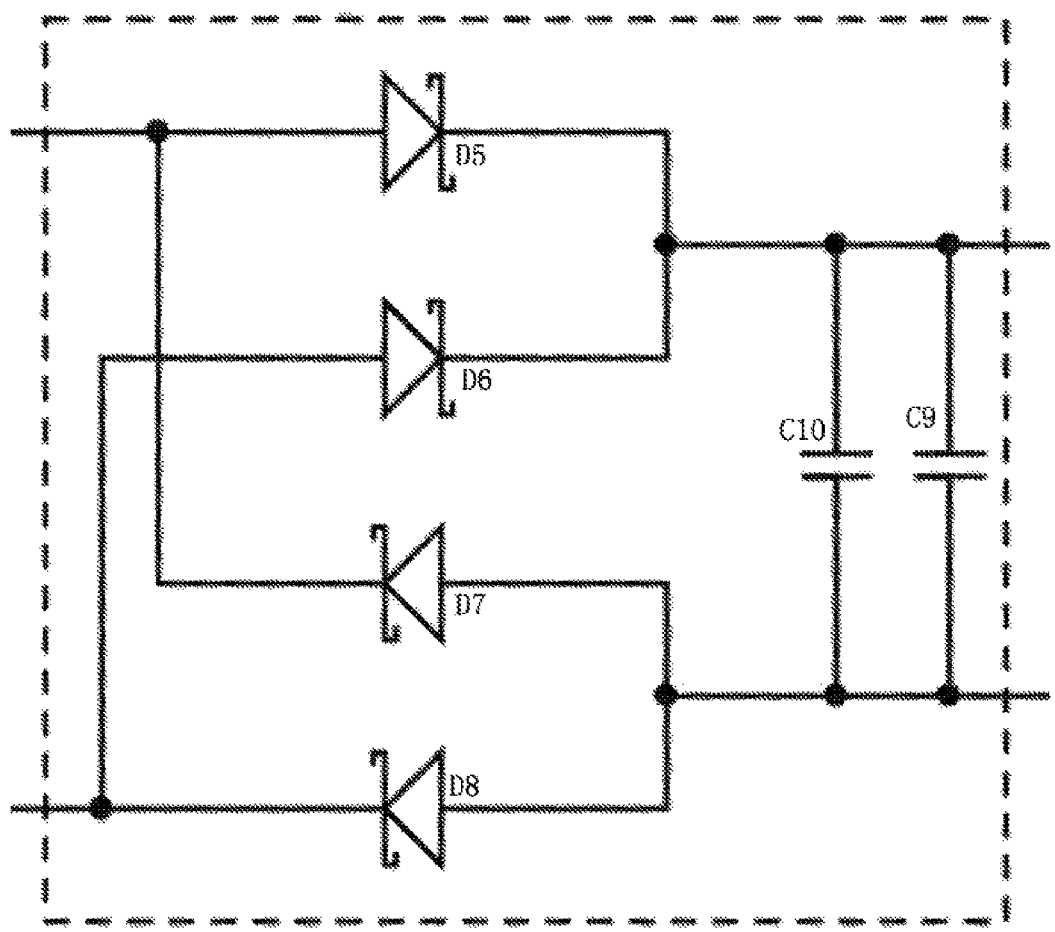
FIG. 3 is an electric schematic diagram of a rectifier and filter unit provided in an embodiment of the present invention.
Figure 4:
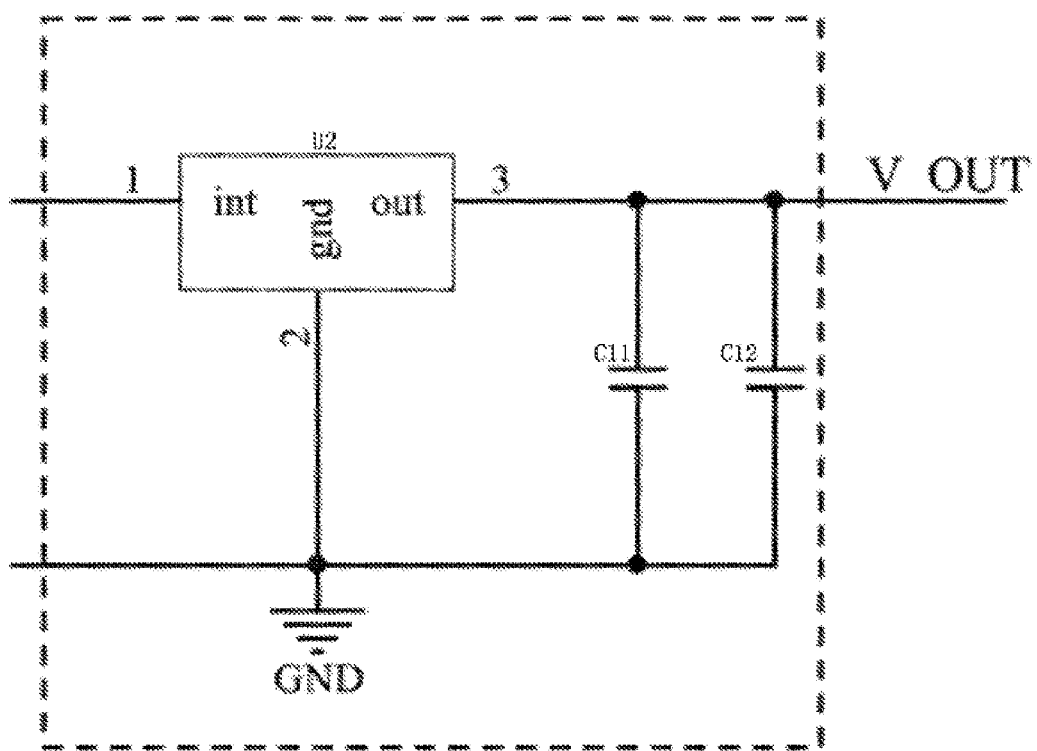
FIG. 4 is an electric schematic diagram of a voltage regulator unit provided in an embodiment of the present invention.

As shown in FIG. 1, a wireless communication system with energy transmission is provided. The wireless communication system includes a control module, a MOS driving module, a MOS power amplifier module, an electric-to-magnetic conversion module, a magnetic-to-electric conversion module, a rectifier and voltage regulator module, a voltage output module, an LVDS conversion module, a TTL signal conversion module, a receiving module, a magnetic-ring coupling module and a power supply. An output terminal of the control module is connected with an input terminal of the LVDS conversion module and an input terminal of the MOS driving module, respectively. An output terminal of the MOS driving module is connected with an input terminal of the MOS power amplifier module. The MOS power amplifier module is electrically connected with the power supply. An output terminal of the MOS power amplifier module is connected with an input terminal of the electric-to-magnetic conversion module. The input terminal of the electric-to-magnetic conversion module is also connected with an output terminal of the LVDS conversion module. An output terminal of the electric-to-magnetic conversion module is connected with an input terminal of the magnetic-ring coupling module. An output terminal of the magnetic-ring coupling module is connected with an input terminal of the magnetic-to-electric conversion module. An output terminal of the magnetic-to-electric conversion module is connected with an input terminal of the rectifier and voltage regulator module and an input terminal of the TTL signal conversion module, respectively. An output terminal of the TTL signal conversion module is connected with an input terminal of the receiving module. An output terminal of the rectifier and voltage regulator module is connected with an input terminal of the voltage output module. By adopting the FPGA, electric power and high-speed digital signals can be transmitted at the same time, ensuring completely independent transmission of the electric and digital signals in the transmission process; the system is simple in structure, convenient in use, and high in efficiency.

The electric-to-magnetic conversion module includes an electric-to-magnetic energy conversion unit and an electric-to-magnetic signal conversion unit; an input terminal of the electric-to-magnetic energy conversion unit is connected with the output terminal of the MOS power amplifier module; and an input terminal of the electric-to-magnetic signal conversion unit is connected with the output terminal of the LVDS conversion module.

The magnetic-ring coupling module includes an energy magnetic-ring unit and a signal magnetic-ring unit; an input terminal of the energy magnetic-ring unit is connected with an output terminal of the electric-to-magnetic energy conversion unit; and an input terminal of the signal magnetic-ring unit is connected with an output terminal of the electric-to-magnetic signal conversion unit.

The magnetic-to-electric conversion module includes a magnetic-to-electric energy conversion unit and a magnetic-to-electric signal conversion unit; an input terminal of the magnetic-to-electric energy conversion unit is connected with an output terminal of the energy magnetic-ring unit; an output terminal of the magnetic-to-electric energy conversion unit is connected with the input terminal of the rectifier and voltage regulator module; the input terminal of the signal magnetic-ring unit is connected with an output terminal of the signal magnetic-ring unit; an input terminal of the magnetic-to-electric signal conversion unit is connected with the output terminal of the signal magnetic-ring unit; and an output terminal of the magnetic-to-electric signal conversion unit is connected with the input terminal of the TTL signal conversion module.

The MOS driving module includes a first driving unit and a second driving unit; the first driving unit is identical with the second driving unit, including a resistor R1, a resistor R2, a capacitor C1, a resistor R3, a resistor R4, a resistor R5, a resistor R6, a resistor R7, a resistor R8, a chip U1, a diode D1 and a diode D2; a second pin of the chip U1 is connected with one end of the resistor R1 and a signal PWMHII, respectively; a third pin of the chip U1 is connected with one end of the resistor R2 and a signal PWNLII, respectively; an eighth pin of the chip U1 is connected with one end of the resistor R6, one end of the resistor R7 and a cathode of the diode D1, respectively; a fifth pin of the chip U1 is connected with one end of the resistor R3, one end of the resistor R4 and a cathode of the diode D2, respectively; an anode of the diode D1 is connected with one end of the resistor R8; an anode of the diode D2 is connected with one end of the resistor R5; a seventh pin of the chip U1 connects the capacitor C2 to the eighth pin of the chip U1 and outputs; the other end of the resistor R6 is grounded through a bonding pad; the other end of the resistor R3 is grounded through a bonding pad; a sixth pin of the chip U1 is connected with one end of the capacitor C1 and a power supply VCC+5V, respectively; the other end of the capacitor C1, the other end of the resistor R1, the other end of the resistor R2, and a fourth pin of the chip U1 are all grounded.

The MOS power amplifier module includes a first amplifier unit and a second amplifier unit; the first amplifier unit is identical with the second amplifier unit, including a MOS transistor Q1, a MOS transistor Q2, a resistor R14, a resistor R10, a resistor R13, a capacitor C4, a resistor R12, a resistor R9, a resistor R11 and a capacitor C3; a gate of the MOS transistor Q1 is connected with the other end of the resistor R8 and the other end of the resistor R7, respectively; a source of the MOS transistor Q1 is connected with one end of the resistor R10, one end of the resistor R11 and one end of the capacitor C3, respectively; a drain of the MOS transistor Q1 is connected with one end of the resistor R9 and a power supply VCC, respectively; the other end of the resistor R9 is connected with the other end of the capacitor C3; the resistor R10 is connected with a first pin of the chip U1 and one end of the capacitor C2, respectively, through a bonding pad; the other end of the resistor R11 is connected with one end of the resistor R12, a drain of the MOS transistor Q2, the first pin of the chip U1, one end of the capacitor C2 and the electric-to-magnetic conversion module, respectively; a gate of the MOS transistor Q2 is connected with the other end of the resistor R4 and the other end of the resistor R5, respectively; the source of the MOS transistor Q2 is connected with one end of the resistor R14 and one end of the resistor R13, respectively; the other end of the resistor R13 is grounded, and the other end of the resistor R14 is grounded through a bonding pad.

The control module is an FPGA, and the FPGA comprises an energy output control signal processing unit and a data signal processing unit.

The rectifier and voltage regulator module includes a rectifier and filter unit and a voltage regulator unit, and an output terminal of the rectifier and filter unit is connected with an input terminal of the voltage regulator unit.

The rectifier and filter unit includes a capacitor C9, a capacitor C10, a diode D5, a diode D6, a diode D7 and a diode D8; an anode of the diode D5 is connected with a cathode of the diode D7 and the output terminal of the magnetic-to-electric conversion module, respectively; an anode of the diode D6 is connected with a cathode of the diode D8 and the output terminal of the electric-to-magnetic conversion module, respectively; a cathode of the diode D5 is connected with the cathode of the diode D6, one end of the capacitor C10 and one end of the capacitor C9, respectively; an anode of the diode D7 is connected with an anode of the diode D8, the other end of the capacitor C10 and the other end of the capacitor C9, respectively, and are all grounded.

The voltage regulator unit includes a voltage regulator chip U2, a capacitor C11 and a capacitor C12; a first pin of the voltage regulator chip U2 is connected with the cathode of the diode D5, the cathode of the diode D6, one end of the capacitor C10 and one end of the capacitor C9, respectively; a third pin of the voltage regulator chip U2 is connected with one end of the capacitor C11 and one end of the capacitor C12, respectively, and outputs; and a second pin of the voltage regulator chip U2, the other end of the capacitor C11 and the other end of the capacitor C12 are all grounded.

The working mode of the communication system is as follows: the digital signal transmission system FPGA scrambles data such that the data do not include spectrum components in low frequency bands, for example, when the data rate is 50 Mbps, the equivalent physical frequency is 25 MHz; if the data are scrambled to be prevented from containing spectrum components below 5 MHz, then power transmission and the interference of the data can be distributed within the frequency range of LF-5 MHz, which avoids the working frequency of the subsequent wireless power transmission system; the data is output via an LVDS level signal, the LVDS level signal is externally converted into a TTL signal which is subjected to power amplification and then enters an electric-to-magnetic conversion driver to drive the magnetic-ring coil to transmit high-frequency wireless digital signals to the outside; a receiving terminal senses, through the magnetic-ring coil, magnetic field signals which are transmitted by the transmitting coil and then converts the magnetic field signals into electric signals; the electric signals are filtered at a high pass, amplified and shaped to be reduced into original LVDSs (signals); and the LVDSs are fed into the FPGA of the receiving terminal to be reduced. Due to the combination with the power transmission system, interference and even damage to the original signals will be inevitably caused when data and energy are transmitted at the same time. To avoid this, the frequency of data transmission and the frequency of energy transmission should avoid each other by a large frequency range. A filter is used, when necessary, to eliminate the negative interference caused by the energy transmission system, thus ensuring the stability and reliability of data transmission.

The working mode of the energy (power) system is as follows: in order to realize low-frequency energy transmission, electric energy is radiated into air by means of low-frequency oscillating electromagnetic signals and then received. The specific process is as follows: The FPGA generates PWM control signals (with dead zone control) at a low frequency (the main energy frequency band of the square wave frequency spectrum is below 2 MHz), and a MOSFET driving circuit drives a power MOSFET to carry out power amplification and to drive the magnetic-ring of the electric-to-magnetic conversion coil to radiate electric energy to the outside. The receiving terminal converts magnetic energy into electric energy after the electromagnetic signals radiated by the transmitting terminal are coupled to the receiving terminal through a coil with a magnetic-ring. Further, a constant voltage and a constant current are output by a rectifier and voltage regulator circuit, and then are supplied to other circuits for using. Through the magnetic-coupling integrated design of the energy transmission system and the signal transmission system, data signals and energy signals are transmitted within different frequency band ranges of the same magnetic link. In this way, the working frequency of the energy transmission system is increased to the maximum extent with the efficiency and interference taken into consideration, so as to maximize the system efficiency.

The FPGA in the control module sends out control signals at the same time. One path of the signals is output to the LVDS conversion module to convert an LVDA signal into a TTL signal; the TTL signal is then output to the electric-to-magnetic conversion module; the electric-to-magnetic conversion module receives the TTL signal, converts the electric signal into a magnetic signal, and outputs the magnetic signal to the magnetic-ring coupling module; the magnetic-ring coupling module performs wireless conversion on the magnetic signal through coupling and then outputs the converted signal to the magnetic-to-electric conversion module; the magnetic-to-electric conversion module reduces the received magnetic signal into the TTL signal and then outputs the TTL signal to the TTL signal conversion module; the TTL signal conversion module converts the received TTL signal into the LVDS and then outputs the LVDS to the receiving module to complete signal transmission. The other path of the output signals is input to the MOS driving module; the MOS driving module drives the MOS transistors of the MOS power amplifier module to carry out power amplification and drives the magnetic-ring of the electric-to-magnetic conversion coil to radiate electric energy to the outside; after the electromagnetic signal radiated by the transmitting terminal is coupled to the receiving terminal through the coil with the magnetic-ring, magnetic energy is converted into electric energy. Then, a constant voltage and a constant current are output by the rectifier and voltage regulator module and are then supplied to other circuits for use.

The above embodiments are merely preferable ones of the present invention, and are not intended to limit the present invention. Any modifications, equivalent alternatives and improvements made on the basis of the concept and principle of the present invention shall fall within the protective scope of the present invention.

What is claimed is:

1. A wireless communication system with an energy transmission function, characterized in that the wireless communication system comprises a control module, a MOS driving module, a MOS power amplifier module, an electric-to-magnetic conversion module, a magnetic-to-electric conversion module, a rectifier and voltage regulator module, a voltage output module, an LVDS conversion module, a TTL signal conversion module, a receiving module, a magnetic-ring coupling module and a power supply; an output terminal of the control module is connected with an input terminal of the LVDS conversion module and an input terminal of the MOS driving module, respectively; an output terminal of the MOS driving module is connected with an input terminal of the MOS power amplifier module; the MOS power amplifier module is electrically connected with the power supply; an output terminal of the MOS power amplifier module is connected with an input terminal of the electric-to-magnetic conversion module; the input terminal of the electric-to-magnetic conversion module is also connected with an output terminal of the LVDS conversion module; an output terminal of the electric-to-magnetic conversion module is connected with an input terminal of the magnetic-ring coupling module; an output terminal of the magnetic-ring coupling module is connected with an input terminal of the magnetic-to-electric conversion module; an output terminal of the magnetic-to-electric conversion module is connected with an input terminal of the rectifier and voltage regulator module and an input terminal of the TTL signal conversion module, respectively; an output terminal of the TTL signal conversion module is connected with an input terminal of the receiving module, and an output terminal of the rectifier and voltage regulator module is connected with the an input terminal of the voltage output module.

2. The wireless communication system according to claim 1, wherein the electric-to-magnetic conversion module comprises an electric-to-magnetic energy conversion unit and an electric-to-magnetic signal conversion unit; an input terminal of the electric-to-magnetic energy conversion unit is connected with the output terminal of the MOS power amplifier module; and an input terminal of the electric-to-magnetic signal conversion unit is connected with the output terminal of the LVDS conversion module.

3. The wireless communication system according to claim 2, wherein the magnetic-ring coupling module comprises an energy magnetic-ring unit and a signal magnetic-ring unit; an input terminal of the energy magnetic-ring unit is connected with an output terminal of the electric-to-magnetic energy conversion unit; and an input terminal of the signal magnetic-ring unit is connected with an output terminal of the electric-to-magnetic signal conversion unit.

4. The wireless communication system according to claim 3, wherein the magnetic-to-electric conversion module comprises a magnetic-to-electric energy conversion unit and a magnetic-to-electric signal conversion unit; an input terminal of the magnetic-to-electric energy conversion unit is connected with an output terminal of the energy magnetic-ring unit; an output terminal of the magnetic-to-electric energy conversion unit is connected with the input terminal of the rectifier and voltage regulator module; the input terminal of the signal magnetic-ring unit is connected with an output terminal of the signal magnetic-ring unit; an input terminal of the magnetic-to-electric signal conversion unit is connected with the output terminal of the signal magnetic-ring unit; and an output terminal of the magnetic-to-electric signal conversion unit is connected with the input terminal of the TTL signal conversion module.

5. The wireless communication system according to claim 4, wherein the MOS driving module comprises a first driving unit and a second driving unit; the first driving unit is identical with the second driving unit and comprises a resistor R1, a resistor R2, a capacitor C1, a resistor R3, a resistor R4, a resistor R5, a resistor R6, a resistor R7, a resistor R8, a chip U1, a diode D1 and a diode D2; a second pin of the chip U1 is connected with one end of the resistor R1 and a signal PWMHII, respectively; a third pin of the chip U1 is connected with one end of the resistor R2 and a signal PWNLII, respectively; an eighth pin of the chip U1 is connected with one end of the resistor R6, one end of the resistor R7 and a cathode of the diode D1, respectively; a fifth pin of the chip U1 is connected with one end of the resistor R3, one end of the resistor R4 and a cathode of the diode D2, respectively; an anode of the diode D1 is connected with one end of the resistor R8; an anode of the diode D2 is connected with one end of the resistor R5; a seventh pin of the chip U1 connects the capacitor C2 to the eighth pin of the chip U1 and outputs; the other end of the resistor R6 is grounded through a bonding pad; the other end of the resistor R3 is grounded through a bonding pad; a sixth pin of the chip U1 is connected with one end of the capacitor C1 and a power supply VCC+5V, respectively; the other end of the capacitor C1, the other end of the resistor R1, the other end of the resistor R2, and a fourth pin of the chip U1 are all grounded.

6. The wireless communication system according to claim 5, wherein the MOS power amplifier module comprises a first amplifier unit and a second amplifier unit; the first amplifier unit is identical with the second amplifier unit and comprises a MOS transistor Q1, a MOS transistor Q2, a resistor R14, a resistor R10, a resistor R13, a capacitor C4, a resistor R12, a resistor R9, a resistor R11 and a capacitor C3; a gate of the MOS transistor Q1 is connected with the other end of the resistor R8 and the other end of the resistor R7, respectively; a source of the MOS transistor Q1 is connected with one end of the resistor R10, one end of the resistor R11 and one end of the capacitor C3, respectively; a drain of the MOS transistor Q1 is connected with one end of the resistor R9 and a power supply VCC, respectively; the other end of the resistor R9 is connected with the other end of the capacitor C3; the resistor R10 is connected with a first pin of the chip U1 and one end of the capacitor C2, respectively, through a bonding pad; the other end of the resistor R11 is connected with one end of the resistor R12, a drain of the MOS transistor Q2, the first pin of the chip U1, one end of the capacitor C2 and the electric-to-magnetic conversion module, respectively; a gate of the MOS transistor Q2 is connected with the other end of the resistor R4 and the other end of the resistor R5, respectively; a source of the MOS transistor Q2 is connected with one end of the resistor R14 and one end of the resistor R13, respectively; the other end of the resistor R13 is grounded, and the other end of the resistor R14 is grounded through a bonding pad.

7. The wireless communication system according to claim 6, wherein the control module is an FPGA, and the FPGA comprises an energy output control signal processing unit and a data signal processing unit.

8. The wireless communication system according to claim 7, wherein the rectifier and voltage regulator module comprises a rectifier and filter unit and a voltage regulator unit, and an output terminal of the rectifier and filter unit is connected with an input terminal of the voltage regulator unit.

9. The wireless communication system according to claim 8, wherein the rectifier and filter unit comprises a capacitor C9, a capacitor C10, a diode D5, a diode D6, a diode D7 and a diode D8; an anode of the diode D5 is connected with a cathode of the diode D7 and the output terminal of the magnetic-to-electric conversion module, respectively; an anode of the diode D6 is connected with a cathode of the diode D8 and the output terminal of the electric-to-magnetic conversion module, respectively; a cathode of the diode D5 is connected with a cathode of the diode D6, one end of the capacitor C10 and one end of the capacitor C9, respectively; an anode of the diode D7 is connected with an anode of the diode D8, the other end of the capacitor C10 and the other end of the capacitor C9, respectively, and are all grounded.

10. The wireless communication system according to claim 9, wherein the voltage regulator unit comprises a voltage regulator chip U2, a capacitor C11 and a capacitor C12; a first pin of the voltage regulator chip U2 is connected with the cathode of the diode D5, the cathode of the diode D6, one end of the capacitor C10 and one end of the capacitor C9, respectively; a third pin of the voltage regulator chip U2 is connected with one end of the capacitor C11 and one end of the capacitor C12, respectively, and outputs; and a second pin of the voltage regulator chip U2, the other end of the capacitor C11 and the other end of the capacitor C12 are all grounded.

* * * * *